United States Patent [19]

Hosseinzadeh et al.

[11] Patent Number: 5,499,161

[45] Date of Patent: Mar. 12, 1996

[54] FLEXIBLE PREAMPLIFIER INTEGRATED CIRCUIT ASSEMBLIES AND METHOD

[75] Inventors: Ali Hosseinzadeh, Fremont; Maziar Amirkiai, Sunnyvale, both of Calif.

[73] Assignee: Quantum Corporation, Milpitas, Calif.

[21] Appl. No.: 198,871

[22] Filed: Feb. 18, 1994

[51] Int. Cl.[6] .................................................. H05K 1/14
[52] U.S. Cl. ..................... 361/749; 361/748; 360/98.01
[58] Field of Search ............................. 174/254, 268, 174/69, 72 A, 72 TR, 117 F, 117 FF; 354/485, 471; 361/749; 439/67, 77; 360/103–106, 98.01

[56] References Cited

U.S. PATENT DOCUMENTS

| | | | |
|---|---|---|---|
| 4,680,675 | 7/1987 | Sato | 361/749 |
| 4,811,165 | 3/1989 | Currier et al. | 361/749 |
| 4,991,290 | 2/1991 | Mackay | 439/67 |
| 5,007,842 | 4/1991 | Deak et al. | 439/67 |
| 5,027,241 | 6/1991 | Hatch et al. | 360/105 |
| 5,029,325 | 7/1991 | Higgins, III et al. | 257/723 |
| 5,065,227 | 11/1991 | Frankeny et al. | 257/723 |
| 5,255,136 | 10/1993 | Machado et al. | 360/77.02 |

*Primary Examiner*—Donald Sparks
*Attorney, Agent, or Firm*—David B. Harrison; John C. Chen

[57] ABSTRACT

A flexible circuit assembly to provide communication to and from data transducer heads located on a load beam of a suspension assembly of a disk drive. Two discrete preamplifier integrated circuits, one of which has a pin-out that is a mirror image of the other, are mounted on a flexible circuit substrate such that the mirror image preamplifier integrated circuit mounted thereon folds underneath the first preamplifier integrated circuit. A head-arm access strip of the flexible circuit is installed in a distorted S-shaped bow in order to reduce the force on the suspension assembly.

18 Claims, 5 Drawing Sheets

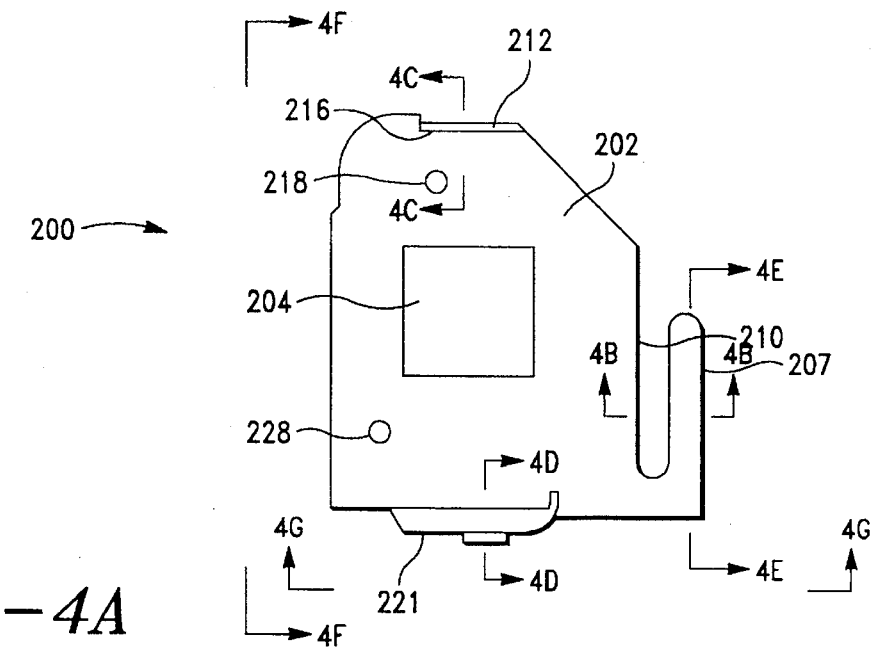
FIG.—4A
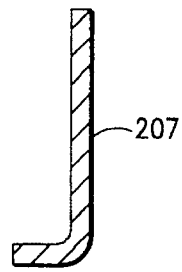
FIG.—4B
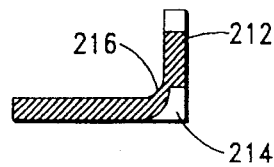
FIG.—4C
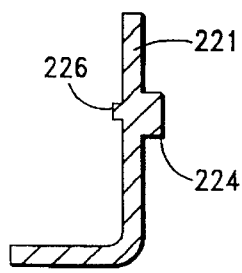
FIG.—4D
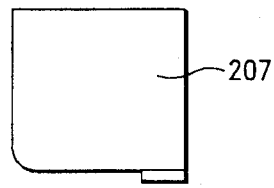
FIG.—4E
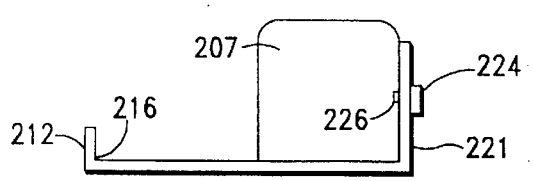
FIG.—4F
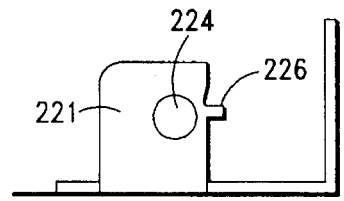
FIG.—4G

FLEXIBLE PREAMPLIFIER INTEGRATED CIRCUIT ASSEMBLIES AND METHOD

FIELD OF THE INVENTION

The present invention pertains to flexible integrated circuit assemblies and methods for assembling them and more specifically flexible preamplifier integrated circuit assemblies for and methods for assembling them in miniature disk drives.

BACKGROUND OF THE INVENTION

In the computer industry, there is a constant demand for products that are both smaller, less expensive and have higher performance. The hard disk drive used in virtually every personal computer has traditionally been one of the largest and most expensive components installed therein. Thus, disk drive manufacturers have continuously tried to decrease the size and cost of their drives while at the same time increasing the amount of mass storage provided.

As is well known in the art, any rotating memory mass storage device includes at least one disk (whether removable or fixed), a head arm assembly and read/write circuitry. As form-factors are reduced, there is a desire to reduce the size of these components. For an example of a height-reduced disk drive and head-arm assembly, see U.S. Pat. No. 5,027,241 which is hereby incorporated by reference and which is assigned to the same assignee as this application and U.S. patent application Ser. No. 08/198855, entitled "LOW PROFILE HEAD SUSPENSION ASSEMBLIES AND METHOD", filed of even date and assigned to the same assignee of the invention of this present application, which is hereby incorporated herein by reference. The read/write circuitry, which typically has included an integrated circuit and related components mounted on a flexible plastic film substrate, is used for electrically selecting and connecting the read/write heads to the drive read/write channel electronics and for conditioning the digital information to be written onto the disk and for pre amplifying the analog signal stream read back from the disk. Because of the need to make disk drive form-factors smaller while reducing the cost of the drive, it would be desirable to reduce the size of the flexible integrated circuit assembly and decrease the cost of assembly.

SUMMARY OF THE INVENTION

The present invention overcomes the problems and disadvantages of the prior art through a unique arrangement of integrated circuit components and flexible circuit construction. The flexible substrate is constructed such that it can sustain a one-hundred eighty degree bend or fold and plural integrated circuits are arranged to avoid electrical interference between the components while reducing the overall area needed in the mass storage device for mounting the flexible circuit. Further, a unique mounting bracket serves as a ground and assembly fixture to enable assembly of the flexible circuit prior to installation in the mass storage device. Finally, a unique method for assembling a flexible circuit is described which reduces the cost of assembly.

The preferred flexible circuit of the present invention comprises a perforation between the main body of the substrate and a flap. A main body read/write integrated circuit is mounted on conductive mounting pads on the component side of the main body of the substrate. Installed on the flap, on the component side of the flexible circuit, is a flap read/write integrated circuit preferably having a pin-out that is a mirror image of the pin-out of the main body read/write integrated circuit.

When the preferred flexible circuit is installed in a drive, the flap is folded along the perforations such that the non-component sides of the flap and main body face each other. Additionally, an integral lead strip of the flexible circuit, which when installed in a drive is oriented perpendicularly to the main body of the flexible circuit, extends in a distorted S-shape to its attachment point on the head/arm assembly.

The above and other preferred features of the invention, including various novel details of construction and combination of parts, will now be more particularly described with reference to the accompanying drawings and pointed out in the claims. It will be understood that the particular device embodying the invention is shown by way of illustration only and not as limitations of the invention. As will be understood by those skilled in the art, the principles and features of this invention may be employed in various and numerous embodiments without departing from the scope of the invention.

BRIEF DESCRIPTION OF THE DRAWINGS

In the Drawings:

FIG. 4a is a diagrammatic top view of a preferred mounting bracket of the present invention for mounting the preamplifier integrated circuit flexible circuit depicted in FIG. 3.

FIG. 4b is a cross-sectional view of a portion of the mounting bracket depicted in FIG. 4a taken along the plane 4b—4b.

FIG. 4c is a cross-sectional view of a portion of the mounting bracket depicted in FIG. 4a taken along the plane 4c—4c.

FIG. 4d is a cross-sectional view of a portion of the mounting bracket depicted in FIG. 4a taken along the plane 4d—4d.

FIG. 4e is a cross-sectional view of the bracket depicted in FIG. 4a taken along the plane 4e—4e.

FIG. 4f is diagrammatic view of the mounting bracket depicted in FIG. 4a along the plane 4f—4f.

FIG. 4g is diagrammatic view of the bracket depicted in FIG. 4a along the plane 4g—4g.

DETAILED DESCRIPTION OF THE PREFERRED EMBODIMENT

Referring now to the figures, the presently preferred flexible integrated circuit assembly and method of the present invention will now be described.

Figure 1:
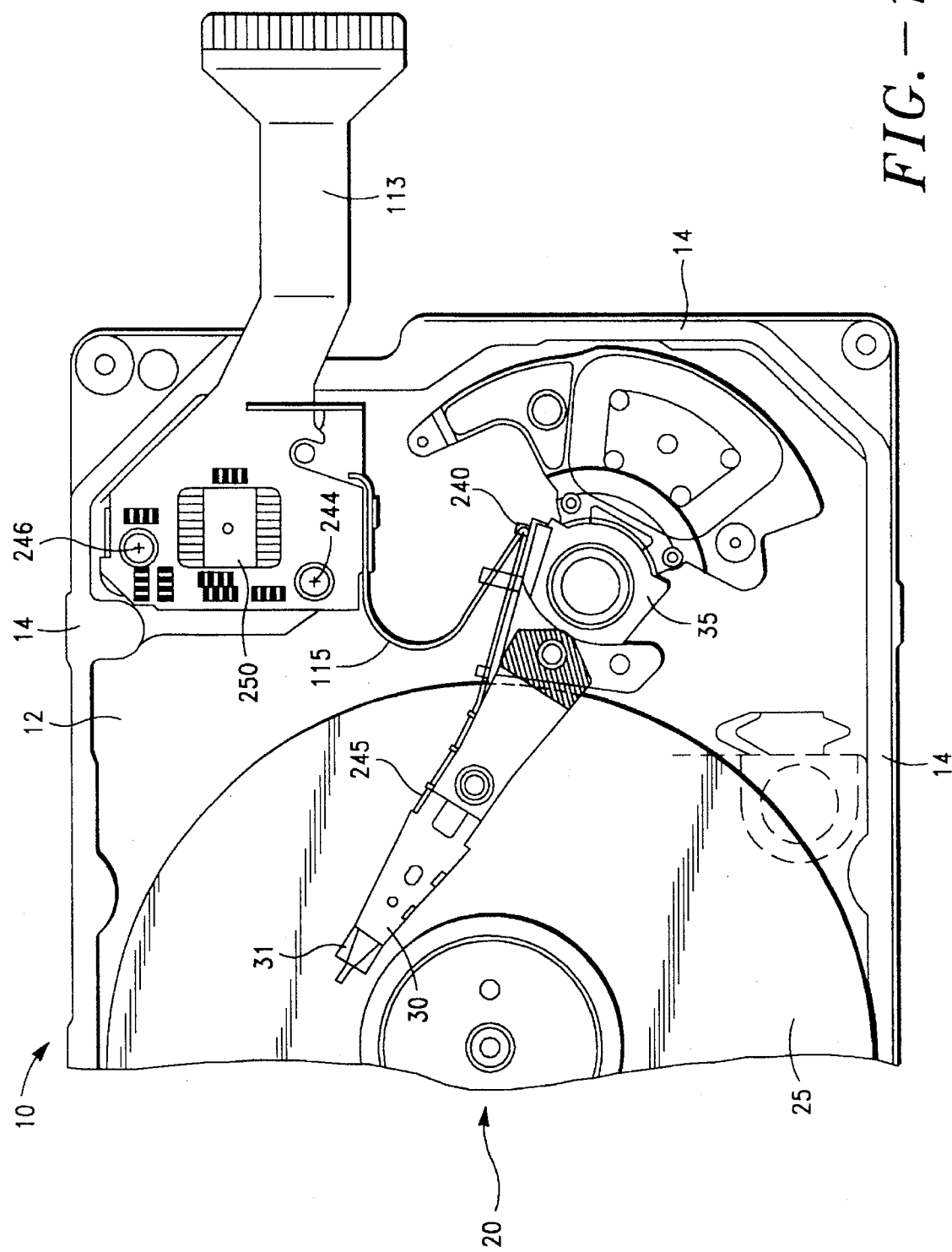
FIG. 1 is a diagrammatic top plan view of a portion of a hard disk drive with a preferred preamplifier integrated circuit flexible circuit in accordance with principles of the present invention.

As thoroughly described in the co-pending application, and with reference to FIG. 1, a disk drive data storage subsystem 10 occupying the volume normally taken by a standard submicro-Winchester form factor (2.5 inch diameter data disks, or smaller) includes a base 12 with integral side walls 14. It should be noted that while the preferred preamplifier integrated circuit flexible circuit is described in the context of a submicro-Winchester form factor, the preferred flexible circuit and invention can be used in any form factor mass storage device. The benefits of the size and cost can be realized in any drive. For example, the use of the invention in a three and one-half inch form factor disk drive would result in additional space in the drive for other components if desired.

The base 12 is typically formed of die cast aluminum alloy. A cover 38 (shown in FIG. 6) fits on base 12 and walls 14 and is adapted to seal the interior of the disk drive against intrusion of particulate contaminants. A rotary disk drive platter assembly 20 having plural stacked disks 25 mounted on a single rotating hub is provided. Such a disk drive platter assembly 20 can be constructed using conventional methods and components, an example of which is described in commonly assigned U.S. Pat. No. 5,208,712 which has been incorporated by reference herein.

A particular track of a disk storage surface of the platter assembly 20 is selected by moving a plurality of vertically aligned head suspension assemblies 30 commonly affixed to an E-block actuator structure 35 to a cylinder location, and then selecting a particular data transducer head (e.g. head 31 of the uppermost surface) corresponding to the particular storage surface containing the desired track (the term "head" is sometimes used herein to include both the electromagnetic head winding and the ceramic slider structure which carries or incorporates the head winding). The E-block rotary voice coil actuator 35 is rotatably mounted about a shaft (not shown) installed in base 12. It is the heads 31 that write data to and read data from the disks 25. In order to properly perform this function, the heads must communicate with circuitry outside the head and disk assembly of the disk drive 10.

Figure 2:
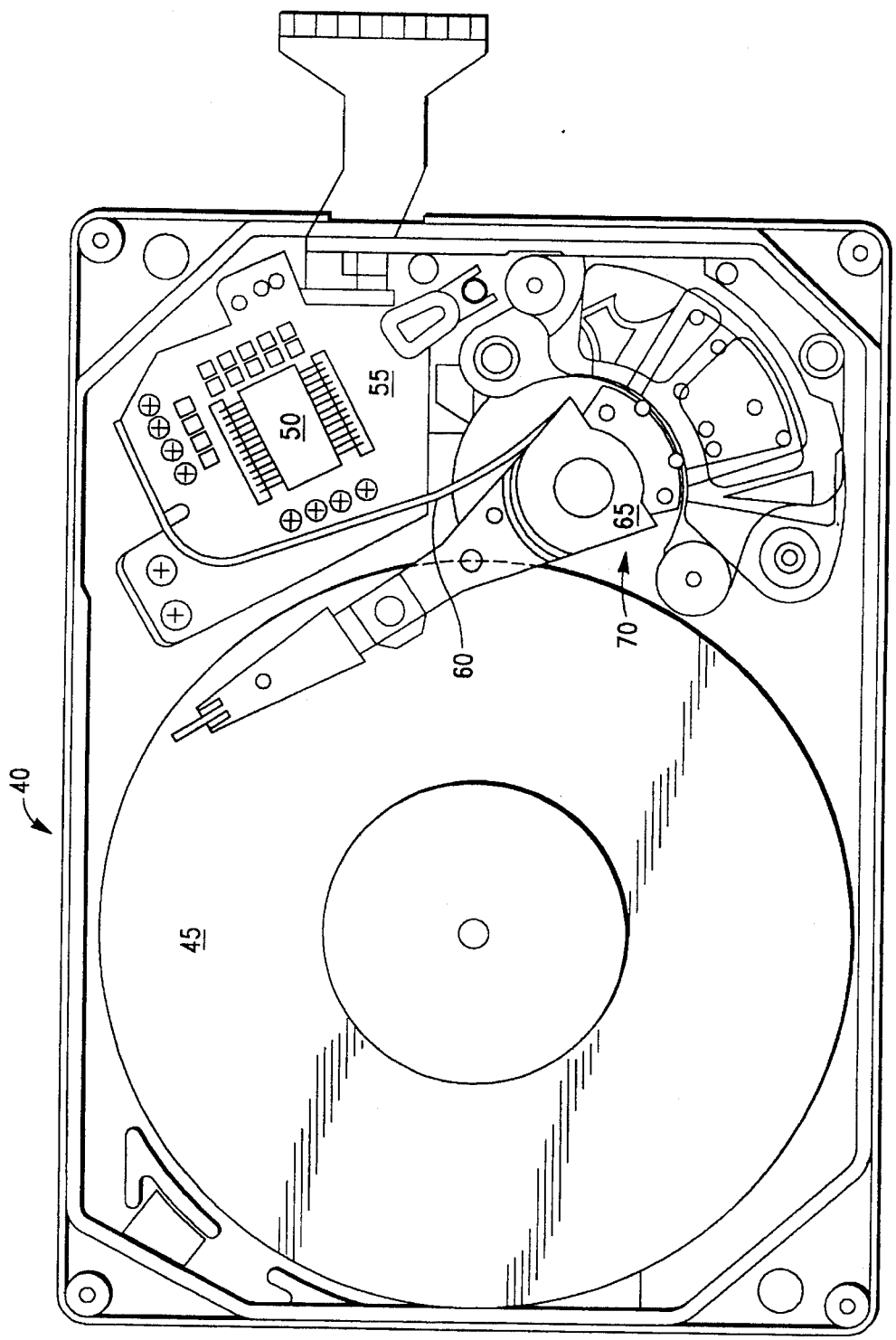
FIG. 2 is a diagrammatic top view of a disk drive with a prior art preamplifier integrated circuit flexible circuit installed in the manner taught by the prior art.

As shown in FIG. 2, prior art disk drive head and disk assemblies traditionally include a flexible circuit assembly installed within the drive 10. The prior art flexible circuit assembly has a single driver/preamplifier integrated circuit mounted thereon. As further shown in FIG. 2, prior art disk drives containing four disks 40 typically utilized a single eight-channel preamplifier integrated circuit 50 (in a disk drive having four disks, there will usually be seven or eight disk surfaces, which generally requires at least seven or eight heads and therefore at least seven or eight channels). The single integrated circuit 50 used in the prior art was traditionally mounted on a single-layer thin flexible polyester film (e.g. Mylar(TM)) circuit substrate 55 or a solid PC board connected to a plastic film lead strip for connection to the disk drive's external electronics circuit board.

Figure 3:
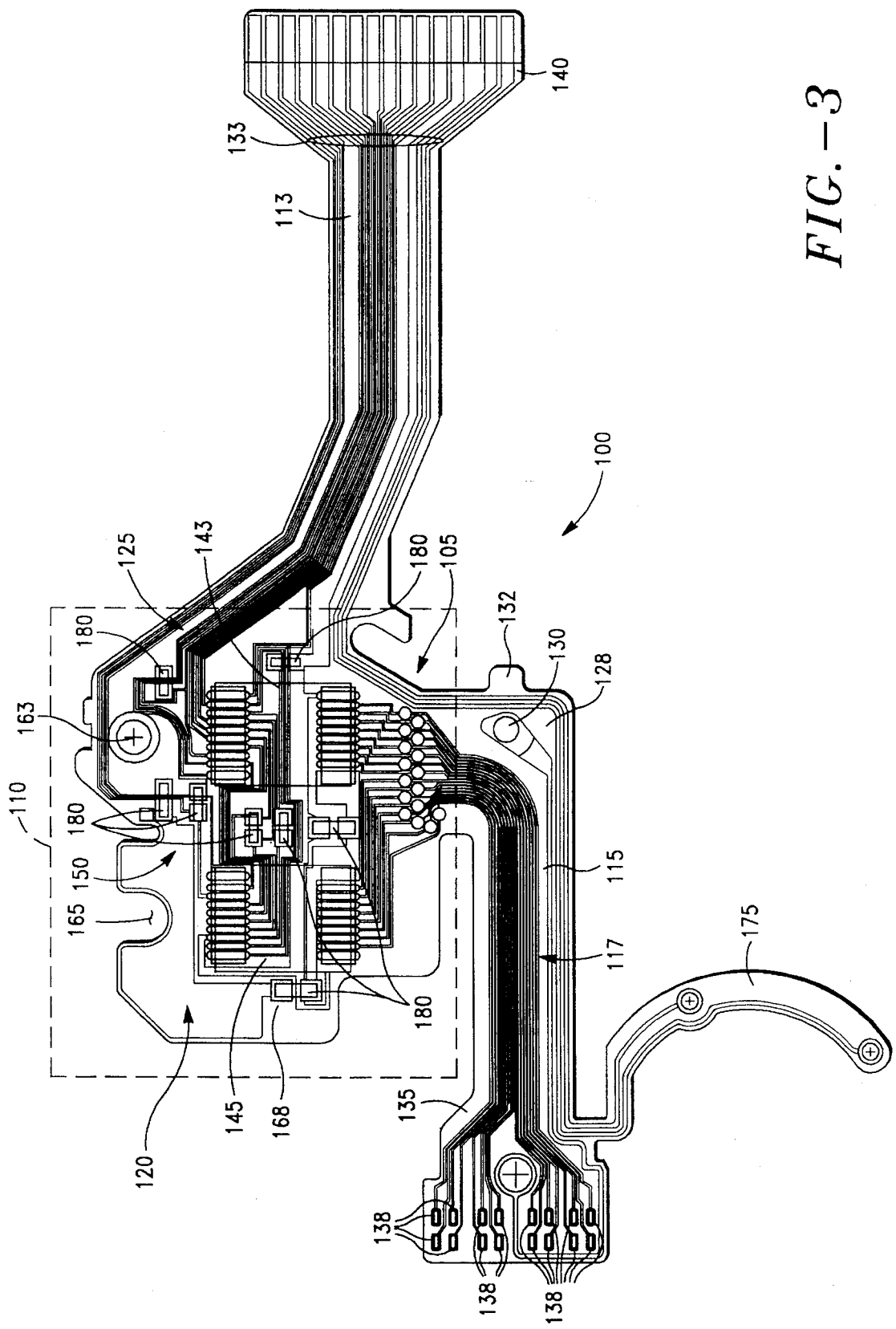
FIG. 3 is a diagrammatic top view of a preferred preamplifier integrated circuit flexible circuit of the present invention.

Referring to FIG. 3, a preferred flexible circuit 100 in accordance with the present invention is shown. The base of the flexible circuit 100 has a substrate 105 which is preferably constructed of thin polyester sheet material e.g. Mylar (TM). The flexible circuit 100 forms component portion 110, an access strip 113 which provides connective trace patterns 133 for connection to the external drive electronics, and a head-arm lead strip 115 which leads to the E-block 35 for connection to the heads and includes conducting trace patterns 117. The preferred component portion 110 comprises a flap 120 and a main body 125.

The head-arm lead strip 115 has a fastening portion 1–28 that has a fastening hole 130 and a biasing tab 132. The head-arm lead strip 115 extends to an actuator connector 135 which has a set of head wire connection contacts 138 and a connection cable 175 which attaches to the E-block 35 to supply bi-directional driving current to the actuator voice coil. The number of contacts 138 can correspond to the number of heads, which may be dependent on the number of disks 25 present in the drive 10. Access strip 113 extends from the mounting portion 110 to a connector 140. Connector 140 is generally plugged into the drive electronics circuit board (not shown) located externally of the FIG. 1 head and disk assembly.

Figure 5:
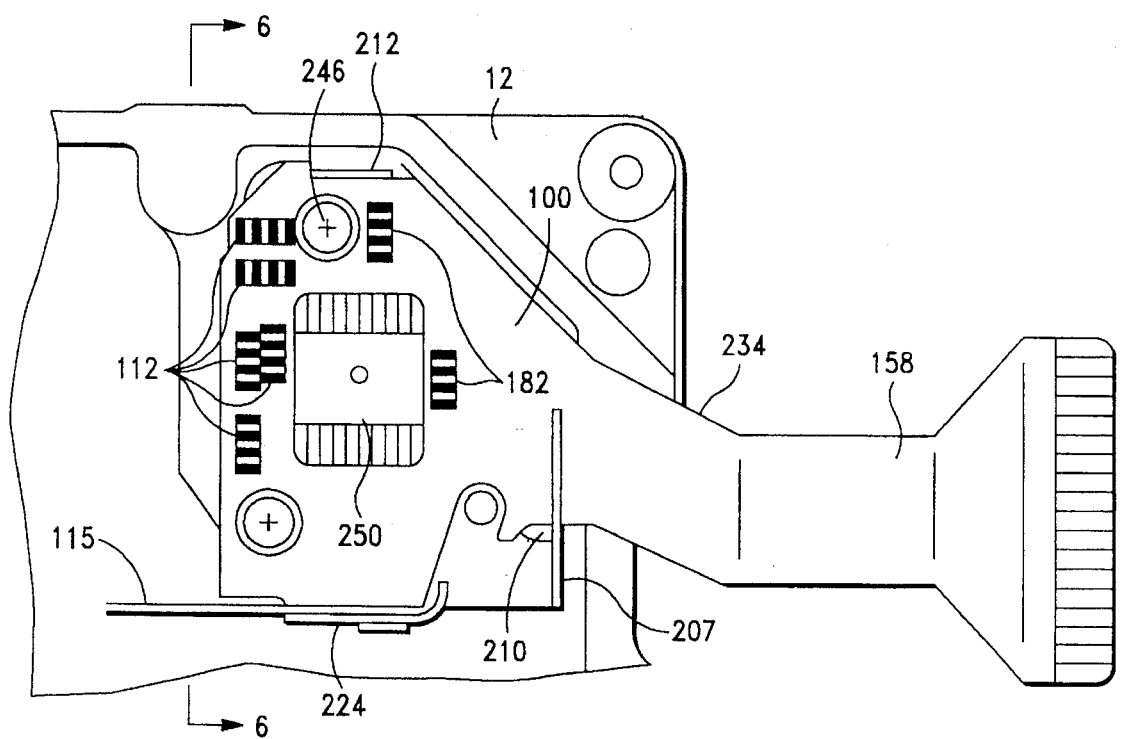
FIG. 5 is diagrammatic top view of the preferred preamplifier integrated circuit flexible circuit depicted in FIG. 3 installed on the preferred mounting bracket within the head and disk assembly of a submicro-Winchester disk drive.
Figure 6:
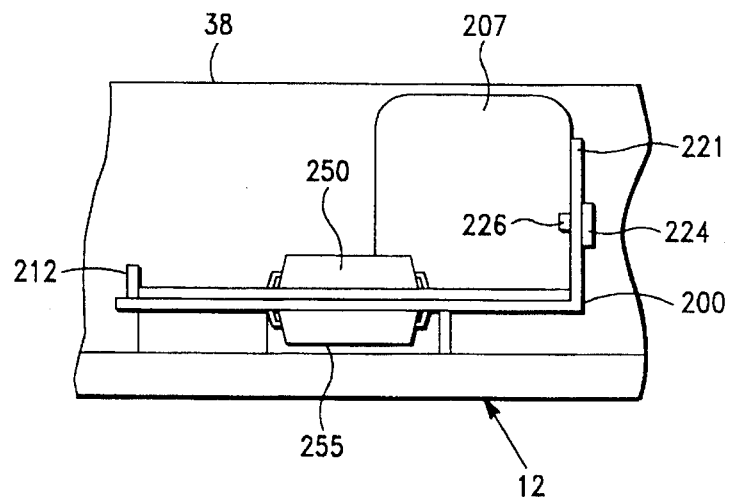
FIG. 6 is diagrammatic side view in elevation and partial section of the preferred preamplifier integrated circuit flexible circuit installed on the preferred mounting bracket, as depicted in FIG. 5 taken along the plane 6—6.

An inner mounting location 143 is formed on the component side of the main body 125 and preferably has its pin locations, or "pin-out", selected to receive e.g. a four channel preamplifier integrated circuit 250 (shown in FIGS. 5 and 6). Likewise, an outer mounting location 145 is formed on the same component side of flap 120 and preferably has its pin-out selected to receive a second e.g. four-channel preamplifier integrated circuit 255 (shown in FIG. 6). This second four-channel preamplifier integrated circuit 255 preferably is electrically identical to the first integrated circuit 250, yet has a pin-out arranged to be a mirror image of the pin-out of the four-channel preamplifier integrated circuit 250.

The component portion 110 is formed to allow the flap 120 to be folded so that the non-component sides of the substrate of the flap 120 and main body 125 are facing each other. Preferably, a perforation line 150 is formed between the main body 125 and the flap 120. The perforation line 150 enables the flap 120 of the flexible circuit 100 to be folded underneath the main body 125 of the flexible circuit 100 such that after folding, the non-component sides of the main body 125 and flap 120 wind up facing each other. This could of course be accomplished in many ways. For example, if the flap 126 and main body 125 were formed from a semi-rigid substrate, a second piece of Mylar could be attached between them.

In addition to the inner mounting portion 143, the preferred main body 125 has several chip resistor mounting locations 180 formed thereon. When the flexible circuit 100 is assembled, chip resistors 182 are placed on the chip resistor mounting locations 180. Naturally, the number of chip resistors 182 installed on the flexible circuit 100 and their installation location depends upon the number of disks 25 installed in the drive 10 and/or the preamplifier integrated circuit selected. The chip resistors 182, when installed on the chip resistor mounting locations 180, are in electrical communication with various pins on the integrated circuits 250, 255 and can be used as switches to set the integrated circuits 250, 255 for how many heads they will be controlling. For example, if the drive 10 has two disks 25 and four heads, chip resistors 182 may be installed on the substrate 205 to set the integrated circuit 250 to control four heads. If the drive 10 has four disks 25 and eight heads, the chip resistors 182 may be installed on substrate 205 to set integrated circuits 250, 255 to control eight heads.

The use of the mirror image preamplifier integrated circuit 255 provides a distinct advantage because it allows the use of a single layer Mylar circuit substrate 105. Because it is desirous that the substrate 105 encompass a small area, one way to accomplish this is to have a limited number of circuit traces (not shown) formed therein. If the mirror image preamplifier integrated circuit 255 is not used, a very expensive two layer flexible circuit substrate would otherwise have to be used in order to maintain the same small size. To provide a mirror image preamplifier integrated circuit 255, a custom integrated circuit can be fabricated. Alternatively, it is possible to use a standard off-the-shelf four channel preamplifier integrated circuit 250. An example of such a standard integrated circuit is the D84652/84652R manufactured by National Semiconductor. Since the preamplifier integrated circuits 250, 255 will be surface mounted to the flexible circuit 100, they can be packaged in flat-pack packages, known as "flat-packs". As is well known in the art, a flat-pack's leads fan outwardly from the side of the package. Prior to installation, the leads are preferably otherwise unformed. Thus, in order to achieve a mirror image pin-out, the flat-pack can be turned over and its leads formed in an opposite fashion to those of the right-side-up flat-pack. This latter method helps keep the cost of the flexible circuit low.

Using two discrete preamplifier integrated circuits also provides many advantages. Firstly, using two preamplifier integrated circuits 250, 255 provides advantages during servo-writing when the drive head-arm assembly is used for servo-writing. During servo-writing, all the heads are sometimes selected and driven simultaneously, in order to conserve manufacturing time. This results in the preamplifier integrated circuit generating a considerable amount of localized heat. With two preamplifier integrated circuits 250, 255, one half the total heat is generated by each circuit, and because there are two circuits, the heat may be more efficiently dissipated without potential for harming or destroying the chips 250, 255. Further, the same flexible circuit 100 can be used when the disk drive 10 contains only one or two disks 25. In this case, the mirror image preamplifier integrated circuit 255 is not installed. Finally, currently available eight channel devices are physically larger than four channel devices and therefore may be more difficult to fit into limited space available within an interior of the head and disk assembly of the preferred 2.5 inch form factor disk drive 10.

Folding the flap 120 underneath the main body 125, thereby stacking the integrated circuits 250, 255, does not increase the height of drive 10. As is apparent from the copending application (Ser. No. 08/198805), the height of load beam suspension assemblies are being reduced. However, the combined height of two stacked integrated circuits 250, 255 is less than the height of even the reduced height load beam suspension assembly described in the copending application. Further, If only one or two disks 25 are being used in a drive 10, only one integrated circuit 250 need be used. The height of one integrated circuit is less than the height of a load-beam suspension assembly for a single-disk disk drive.

Preferably, the flexible circuit 100 also has a fastening hole 153 located diagonally below the inner mounting location 143. A corresponding hole 155 is located diagonally below the outer mounting location 145 such that when the flap 120 is folded underneath the main body 125, a single mounting hole 160, as seen in FIG. 5 is created. An additional fastening hole 244 is formed above the inner mounting location 143. In addition, the flexible circuit 100 has positioning tab 165 and extension 168 formed thereon that allows simple, fastener-free, attachment to a bracket 200, the details of which are described below.

With reference to FIGS. 4a–4g, bracket 200, which facilitates assembly and installation of flexible circuit 100 into a drive, is now described. It should be noted that while the preferred bracket 200 is described in conjunction with the preferred flexible circuit 100, similar brackets employing the same concepts can be designed for other flexible circuits.

Bracket 200 is preferably constructed of a sheet of aluminum alloy although other appropriate materials may be employed. Disposed in the central portion 202 of the bracket 200 is chip opening 204. Chip opening 204 is large enough to enable a mirror image preamplifier integrated circuit 255 to pass through, as is best seen in FIG. 6, and as discussed below.

Bracket 200 has several flanges 207, 212, 221 that are best understood with reference to the various cross-sections and views shown in FIGS. 4b–4g. All of these flanges are preferably formed perpendicular to the central portion 202 and extend outward from the same side of the central portion 202. For ease in description and location of the particular flanges and other components of the bracket 200, reference to directions such as "top", "above":, "below", etc. may be used with reference to the Figure being discussed. It is understood that these convenient directional references are not limiting and that the bracket 200 can be mounted or used in any orientation. Protective flange 207, shown in FIGS. 4a, 4b, 4e, 4f and 4g, is formed such that a slot 210 is formed between it and the central portion 202. Securing flange 212, shown in FIGS. 4a, 4c and 4f, is formed such that an opening 214 is formed at the fold point 216 of the bracket 200. Below the securing flange 212 and above chip opening 204 is a first through-hole 218. The usefulness of first through-hole 218 will be described in reference to FIG. 5. Connector flange 221, shown in FIGS. 4a, 4d, 4f and 4g, is formed below chip opening 204. Connector flange 221 has a threaded hole 224 formed therethrough and a guiding tab 226 extending therefrom. A second through-hole 228 is formed above connector flange 221.

The preferred method in which the flexible circuit 100 may be assembled in bracket 200 will now be discussed with reference to FIGS. 5 and 6. Flap 120 of flexible circuit 100 is folded underneath the main body 125. It is then placed on bracket 200 such that the mirror image preamplifier integrated circuit 255 soldered to the outer mounting location 145 fits into chip opening 204. Extension 168 of the flap 120 extends beyond chip opening 204 and rests against the inner-surface of bracket 200. Thus, extension 168 helps keep the flap 120 folded under the main body 125 in the bracket 200.

When placed on bracket 200, the flexible circuit 100 is oriented so that fastening portion 128 of the head-arm lead strip 115 covers connector flange 221 and fastening hole 130 is collinear to threaded hole 224. Additionally, tab 132 fits snugly underneath guiding tab 226 providing a downward bias, thereby increasing connection security. Positioning tab 165 is placed in opening 214 of securing flange 212. Finally, access strip 113 passes through slot 210 and then turns upward behind protective flange 207 and exits the interior of disk drive 10 through drive access 234.

In order to permanently fasten flexible circuit 100 to bracket 200, a screw (not shown) can pass through fastening hole 130 and threaded hole 224. This will fasten the fastening portion 128 of the flexible circuit 100 to connector flange 221. To further fasten the flexible circuit 100 to bracket 200 and to additionally fasten the bracket 200 to the base 12 of the drive 10, a screw 246 will pass through fastening hole 163 and notch region 165 of the flexible circuit 100 and first mounting hole 218 of bracket 200 and be threaded into a corresponding opening (not shown) in the base 12 of the drive 10.

Of course, it is not necessary to use bracket 200 when installing the flexible circuit in a drive 10. For example, the features of bracket 200 described above could be formed in the base 12 of the drive 10, thereby eliminating the need for the bracket 200. Use of the bracket 200, however, has advantages. It allows the flexible circuit 100 to be formed prior to installation in drive 10, thereby resulting in the flap 120 being folded underneath the main body 125 and the head-arm lead strip 115 being disposed orthogonal thereto. This enables the flexible circuit 100 to be installed in drive 10 using machine insertion tools, thereby lowering manufacturing costs and increasing quality.

With reference to FIG. 1, the preferred method of connection between the flexible circuit 100 and the load beam suspension assembly 30 will be described. As described, the fastening portion 128 of the head-arm lead strip 115 of the flexible circuit 100 is fixed to connector flange 221. Thus, the head-arm lead strip 115 of the flexible circuit 100 is perpendicularly disposed to the base 12 of the drive 10. To provide for electrical communication between the heads 31 and the preamplifier integrated circuits 250, 255, the head-arm lead strip 115 is guided by a rigid molded plastic forming member 240 affixed to the side of the E-block 35 by a screw (not shown). The head-arm lead strip 115 is guided by an arcuate portion of the guiding member 240 such that the strip 115 is formed into a distorted S-shaped bow. This distorted S-shaped bow provides an advantage over circuit connection schemes of the prior art. In the prior art, as shown in FIG. 2, the head-arm lead strip 60 of the flexible circuit 55 forms an inverse L-shape. The inverse L-shape can create a biasing force against the E-block 65 that tends to force the load beam suspension assembly 70 of the prior art either towards the center of the disk 45 or to the periphery of the disk 45, depending upon where it is attached to the E-block. In contrast, installing the head-arm lead strip 115 in a distorted S-shaped bow yields lower centering bias. This allows use of a head-arm assembly motor requiring lower torque and less power, than that of the prior art and can result in better tracking control.

Once the head-arm lead strip 115 is fastened to the connector 240, wires 245 that run from the head slider to the E-block are then fastened to the contacts 138. This places the integrated circuits 250, 255 in electrical communication with the heads.

Thus, a preferred improved flexible circuit assembly and method has been described. While embodiments and applications of this invention have been shown and described, as would be apparent to those skilled in the art, many more embodiments and applications are possible without departing from the inventive concepts disclosed herein. The invention, therefore is not to be restricted except in the spirit of the appended claims.

What is claimed is:

1. A flexible circuit assembly for a mass storage device comprising:

a substrate having a component side and a non-component side comprising:

a mounting portion comprising a main body having a first integrated circuit for supporting basic functionality within the mass storage device by connection to a first group of electrical elements, the first integrated circuit being mounted on a first group of conductive mounting pads formed on said component side and a flap extending from the main body and foldable along a fold line and having a second group of conductive mounting pads formed on said component side for providing connections to an optional, second integrated circuit functionally duplicative of the first integrated circuit for supporting additional functionality within the mass storage device by connection to a second group of electrical elements of the same type connected to the first integrated circuit, said substrate configured such that after folding along the fold line said non-component side of said flap faces said non-component side of said main body:

a lead strip extending to a plurality of contacts and a connector strip, said lead strip comprising a plurality of conductive traces in electrical communication with selected pads of said first group of conductive mounting pads and said second group of conductive mounting pads; and an access strip extending to a connector, said access strip comprising a plurality of circuit traces in electrical communication with selected pads of said first group of conductive mounting pads and said second group of conductive mounting pads.

2. The flexible circuit assembly of claim 1 further comprising a resistor mounting pad on the component side of the substrate, and at least one chip resistor mounted to the resistor mounting pad.

3. The flexible circuit assembly of claim 1 comprising the second integrated circuit being mounted on, and connected to, said second group of conductive mounting pads.

4. The flexible circuit assembly of claim 3 wherein said second integrated circuit is electrically identical with said first integrated circuit.

5. The flexible circuit assembly of claim 4 wherein said second integrated circuit has a pin-out which is a mirror image of a pin-out of said first integrated circuit.

6. The flexible circuit assembly of claim 1 wherein said substrate is constructed entirely of a flexible plastic film material.

7. The flexible circuit assembly of claim 6 wherein said substrate defines a single-layer printed circuit on the component side thereof.

8. The flexible circuit assembly of claim 1 wherein said lead strip comprises a fastening area having a through-hole formed therethrough and a biasing tab formed thereon.

9. The flexible circuit assembly of claim 8 wherein said assembly is installed on a mounting plate, said mounting plate comprising a platform and a connector flange, said connector flange extending substantially perpendicular from said platform and having a threaded-hole formed therethrough, said through-hole being concentric with said threaded-hole.

10. The flexible circuit assembly of claim 9 wherein said platform of said mounting plate comprises a chip opening formed therein, said chip opening being slightly larger than said second integrated circuit, said second integrated circuit situated within said chip opening.

11. The flexible circuit assembly of claim 1 wherein said first integrated circuit is a read preamplifier/head select/write driver integrated circuit of a disk drive wherein said first group of electrical elements comprises a first plurality of read/write heads having connection wires connected to to said first integrated circuit via first ones of said plurality of contacts of said lead strip.

12. The flexible circuit assembly of claim 1 wherein said at least one integrated circuit is a read preamplifier/write driver integrated circuit with a first pin-out and comprising a second integrated circuit connected to the other of said first and second group of conductive mounting pads and being a read preamplifier/write driver integrated circuit which is electrically identical with said first integrated circuit and having a pin-out that mirrors said first pin-out.

13. A preamplifier/head select/driver circuit for a miniature Winchester disk drive comprising:

a first read/write integrated circuit mounted on a component side of a flexible substrate and a second read/write integrated circuit mounted on said component side of said flexible substrate such that a non-component side of said flexible substrate with said second read/write integrated circuit installed thereon can be facing said non-component side of said flexible substrate with said first read/write integrated circuit installed thereon, said first read/write integrated circuit comprising a first pin-out and said second read/write integrated circuit comprising a pin-out that mirrors said first pin-out; and an access strip extending to a connector, said access strip comprising a plurality of circuit traces in electrical communication with selected pins of said first read/write integrated circuit and said second read/write integrated circuit.

14. A circuit assembly for internal placement within a rotating-disk mass storage system comprising:

a bracket comprising:
- a central portion, said central portion having a chip opening formed therein;
- a protective flange, said protective flange situated substantially perpendicular to said central portion and having a slot formed between said protective flange and said central portion;
- a securing flange, said securing flange situated substantially perpendicular to said central portion about a fold point and defining a tab opening at said fold point;
- a connector flange, said connector flange situated substantially perpendicular to said central portion and having a threaded hole formed therethrough and a biasing tab extending therefrom;

a flexible circuit comprising:
- a substrate having a mounting portion, said mounting portion comprising a main body and a flap, said main body having a first group of conductive mounting pads and a positioning tab formed thereon and said flap having a second group of conductive mounting pads formed thereon, a lead strip extending from a fastening portion, said fastening portion having a through-hole formed therein and a guide tab formed thereon, to a plurality of contacts and a connector cable, said substrate further comprising an access strip extending to a connector;
- a first integrated circuit mounted on said first group of conductive mounting pads and a second integrated circuit mounted on said second group of conductive mounting pads;
- at least one chip resistor mounted on a resistor mounting pad;

said flexible circuit installed on said bracket such that said flap is folded underneath said main body and said second integrated circuit is within said chip opening, said through-hole of said fastening portion being concentric with said threaded-hole and said guide tab being biased downward by said biasing tab, said positioning tab maintained in said tab opening.

15. The circuit assembly of claim 14 wherein said substrate is constructed of a flexible plastic film and comprises a single-layer printed circuit.

16. A read preamplifier/write driver circuit assembly for a mass storage device comprising:

a flexible integral substrate comprising:
- a mounting portion having a component side and non-component side, said mounting portion comprising a main body and a flap, said main body separated from said flap by a hinge, said main body having a first group of conductive mounting pads formed on said component side and said flap having a second group of conductive mounting pads formed on said component side, said flap folded about said hinge so that said non-component side of said mounting portion comprising said flap faces said non-component side of said mounting portion comprising said main body;
- a lead strip, said lead strip comprising a plurality of first conductive traces in electrical communication with selected pads of said first group of conductive mounting pads and said second group of conductive mounting pads, said lead strip integral to said mounting portion, said first conductive traces extending from said first group of conductive mounting pads and said second group of conductive mounting pads, through a fastening area and to a plurality of contacts, said fastening area having a through-hole formed therethrough and a biasing tab formed thereon, said lead strip further comprising a connector strip;
- an access strip extending to a connector, said access strip comprising a plurality of second circuit traces in electrical communication with selected pads of said group of conductive mounting pads and said second group of conductive mounting pads;
- at least one of a third circuit trace extending from said connector of said access strip to said connector cable;
a first read/write integrated circuit mounted on said first group of conductive mounting pads, said first read/write integrated circuit comprising a first pin out;
a second read/write integrated circuit mounted on said second group of conductive mounting pads, said second read/write integrated circuit having a pin-out that mirrors said first pin out;
at least one chip resistor mounted on a resistor mounting pad; and
a mounting plate, said substrate installed in said mounting plate such that said through-hole is concentric with an orthogonal disposed threaded-hole formed in said mounting plate, said mounting plate maintaining said flap underneath said main body and disposing said lead strip perpendicular to said mounting plate.

17. The read preamplifier/write driver circuit assembly of claim 16 wherein said flexible integral substrate is a single-layer printed circuit board.

18. The read preamplifier/write driver circuit assembly of claim 17 wherein said flexible integral substrate is constructed of a thin polyester sheet.

* * * * *